(12) United States Patent
Al-Awadhi

(10) Patent No.: US 6,683,550 B2
(45) Date of Patent: Jan. 27, 2004

(54) HIGH PRECISION, HIGH-SPEED SIGNAL CAPTURE

(75) Inventor: Ayman A. Al-Awadhi, Brookline, MA (US)

(73) Assignee: Teradyne, Inc., Boston, MA (US)

(*) Notice: Subject to any disclaimer, the term of this patent is extended or adjusted under 35 U.S.C. 154(b) by 0 days.

(21) Appl. No.: 10/016,983

(22) Filed: Dec. 14, 2001

(65) Prior Publication Data

US 2003/0112165 A1 Jun. 19, 2003

(51) Int. Cl.$^7$ ................................. H03M 3/02
(52) U.S. Cl. ........................ 341/143; 341/156
(58) Field of Search .................. 341/143, 155, 341/156

(56) References Cited

U.S. PATENT DOCUMENTS

| 4,131,885 A | 12/1978 | Ninomaya | 340/347 |
|---|---|---|---|
| 5,073,777 A | * 12/1991 | Fukuhara et al. | 341/131 |
| 5,150,120 A | 9/1992 | Yunus | 341/143 |
| 5,196,852 A | 3/1993 | Galton | 341/143 |
| 5,363,101 A | * 11/1994 | Ueki | 341/143 |
| 5,835,044 A | * 11/1998 | Nishino | 341/143 |
| 5,896,100 A | 4/1999 | Panaoussis | 341/108 |
| 6,195,031 B1 | 2/2001 | Feld et al. | 341/159 |
| 6,195,032 B1 | 2/2001 | Watson et al. | 341/162 |

OTHER PUBLICATIONS

Cascaded parallel oversampling sigma–delta modulators Xuesheng Wang; Wei Qin; Xieting Ling Circuits and Systems II: Analog and Digital Signal Processing, IEEE Transactions on , vol. 47 Issue: 2, Feb. 2000, Page(s): 156–161.

Oversampling parallel delta–sigma modulator A/D conversion Galton I.; Jensen, H.T. Circuits and Systems II: Analog and Digital Signal Processing, IEEE Transactions on , vol.: 43 Issue: 12 , Dec. 1996 , Page(s): 801–810.

Effects of quantization noise in parallel arrays of analog–to–digital converters Petraglia, A.; Pinheiro, M.A.A. Circuits and Systems, 1994. ISCAS '94., 1994 IEEE International Symposium on , vol.: 5 , 1994 , Page(s): 337–340 vol. 5.

* cited by examiner

*Primary Examiner*—Howard L. Williams
(74) *Attorney, Agent, or Firm*—Bruce D. Rubenstein

(57) ABSTRACT

A topology for converting an analog input signal at an input port into a corresponding digital output signal at an output port includes a plurality of substantially identical ADC stages. Each ADC stage includes a multi-bit sigma-delta loop having an analog input coupled to the input port and a digital output coupled to a combining circuit. The combining circuit adds the outputs of the ADC stages to generate the digital output signal.

20 Claims, 2 Drawing Sheets

HIGH PRECISION, HIGH-SPEED SIGNAL CAPTURE

CROSS-REFERENCES TO RELATED APPLICATIONS

Not Applicable.

STATEMENT REGARDING FEDERALLY SPONSORED RESEARCH OR DEVELOPMENT

Not Applicable.

Reference to Microfiche Appendix

Not Applicable

BACKGROUND OF THE INVENTION

FIELD OF THE INVENTION

This invention relates generally to circuits for converting electrical signals from analog to digital form, and, more particularly, to applying these circuits in capture instruments for use in automatic test equipment.

DESCRIPTION OF RELATED ART INCLUDING INFORMATION DISCLOSED UNDER 37 C.F.R. 1.97 AND 1.98

Capturing analog signals is a basic function of automatic test equipment for electronics (ATE). A capture instrument converts an analog input signal into a corresponding digital signal, using a circuit conventionally known as an Analog-to-Digital converter, or ADC. As faster and more accurate electronic devices come to market, test systems must be equipped with faster and more accurate ADC's if test systems are to keep pace with advances in new devices. A difficulty arises in the design of ATE, however, because converters that are extremely fast tend to be relatively inaccurate, and converters that are extremely accurate tend to be relatively slow. To promote flexibility for testing a wide range of device characteristics, ATE developers seek to provide both high speed and high accuracy in a single converter topology.

ATE developers have long recognized that the tradeoff between converter speed and accuracy can be somewhat relieved through the use of parallel-connected ADC's. The individual converters from which the parallel topologies have been constructed have customarily been successive approximation converters or flash converters. Parallel connections are established by driving the analog inputs of the ADC's with the same input signal, activating the ADC's simultaneously, and adding the ADCs' outputs to produce a combined digital output signal. Assuming that the noise of each converter exceeds one LSB (Least Significant Bit), the precision of N identical, parallel-connected converters can be increased over the precision of a single converter by approximately $\log_2 N$.

The number of converters cannot be increased indefinitely, however. With each added ADC, cost, space, and especially noise of the overall topology increase. Owing to these diminishing returns, parallel topologies seldom include greater than eight converters. Precision is therefore at most tripled, an improvement that corresponds to fewer than two bits. This level of improvement is generally not enough to allow high-speed ADC's to operate at the level of precision that many applications require. Consequently, the desired combination of speed and precision is generally not attainable at reasonable cost.

BRIEF SUMMARY OF THE INVENTION

With the foregoing background in mind, it is an object of the invention for an ADC topology to be both fast and precise.

To achieve the foregoing object, as well as other objectives and advantages, a parallel topology for converting an analog input signal into a corresponding digital output signal includes a plurality of substantially identical multi-bit sigma-delta stages. Each stage includes a multi-bit sigma-delta loop having an analog input coupled to an input port for receiving the analog input signal and a digital output coupled to a combining circuit. The combining circuit adds the digital outputs of the stages to generate the digital output signal. Noise shaping from the sigma-delta loops increases the precision of the topology beyond that normally achieved using parallel connected converters without sigma-delta loops. This increase in precision allows the topology to be implemented using lower-resolution, higher speed devices than would otherwise be needed.

BRIEF DESCRIPTION OF THE SEVERAL VIEWS OF THE DRAWINGS

Additional objects, advantages, and novel features of the invention will become apparent from a consideration of the ensuing description and drawings, in which.

DETAILED DESCRIPTION OF THE INVENTION

Figure 1:
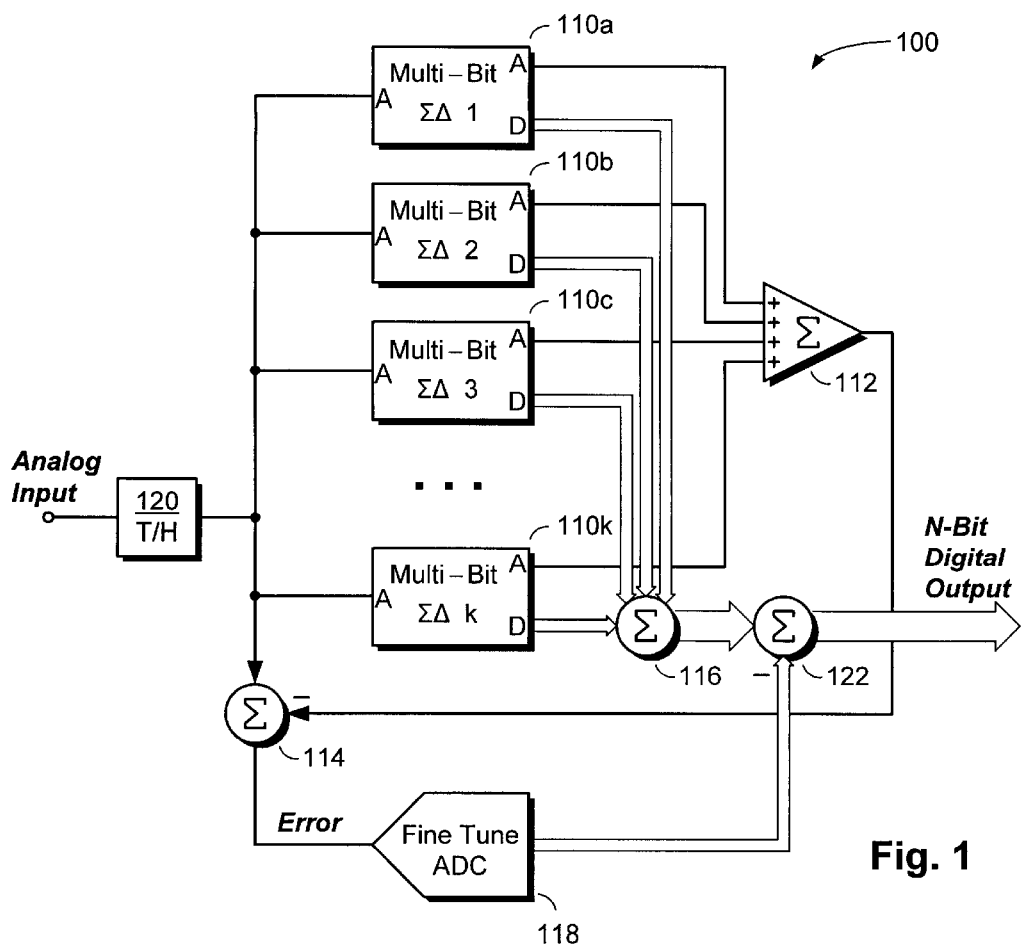
FIG. 1 is a simplified schematic view of a topology according to the invention for converting an analog input signal into a digital output signal.

FIG. 1 shows the preferred embodiment of a converter topology 100 according to the invention. An analog input signal is applied to the input of a track-and-hold circuit 120. The track-and-hold circuit 120 has an output coupled to respective inputs of a plurality of ADC stages 110a–110k. Each ADC stage generates a digital output signal that corresponds to the analog signal applied to its input. The ADC stages 110a–110k preferably operate from a common clock (not shown), which causes them to perform their conversions substantially simultaneously. The track-and-hold circuit 120 preferably operates from a time-advanced version of the same clock, which allows the output of the track-and-hold 120 to settle prior to conversions of the ADC stages. A combining circuit 116 gathers the digital outputs from the ADC stages 110a–110k and sums them together to generate a combined digital output signal.

Preferably, each ADC stage 110a–110k also generates an analog output signal that represents the digital output signal of the respective ADC stage, in analog form. The topology applies the analog outputs for correcting errors in the digital outputs of the ADC stages. A first summer 112 adds the analog outputs from the ADC stages 10a–10k. A second summer 114 subtracts the output of the first summer 112 from the sampled analog input signal, to generate an error signal. A fine tune ADC 118 converts the error signal into digital form, and a digital summer 122 subtracts the digital error signal from the combined digital output signal to generate a corrected signal, "N-bit Digital Output."

Figure 2:
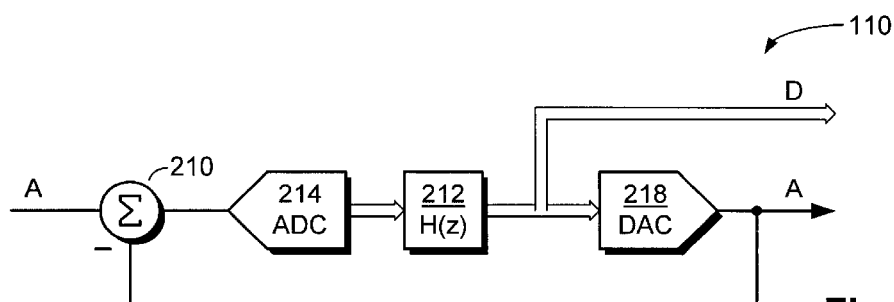
FIG. 2 is a simplified schematic view of a multi-bit sigma-delta ADC stage used in the topology of FIG. 1.

FIG. 2 shows the preferred embodiment of an ADC stage 110, which is typical of the ADC stages 110a–110k. The ADC stage 110 receives an analog input from the track-and-hold circuit 120, and generates both an analog output and a digital output. The ADC stage 110 preferably comprises a single loop, multi-bit sigma-delta converter. The converter includes a summer 210, an ADC 214, a loop filter 212, and a DAC (digital-to-analog converter) 218. The ADC 214 and DAC 218 are preferably monolithic high-speed 18-bit converters. They are preferably integrated on the same chip to provide substantially identical thermal characteristics and gain. The loop filter 212 is preferably an integrator. The summer 210 subtracts the output of the DAC 218 from the analog input signal to produce an error signal. The loop filter 212 integrates the error signal over time. Negative feedback tends to cause the output of the DAC 218 to equal to the analog input of the ADC stage. In so doing, the negative feedback tends to drive the output of the ADC 214 to a value that precisely corresponds to a digital representation of the ADC stage's analog input.

Implementing the ADC stages 110a–110k as sigma-delta loops greatly enhances the precision of the topology 100. As is known, sigma-delta loops provide inherent noise shaping. Although the resolution of the converters 214 and 218 may be limited to 18 bits, the precision of the loop over time greatly exceeds 18 bits due to the tendency of the negative feedback to drive the average of the output to the precise value of the analog input. Although the feedback loop generally requires several samples to settle, the loop still settles quickly due to the high sampling rate. Therefore, the multi-bit sigma-delta loop greatly improves precision without unduly impacting speed.

Owing to the noise shaping provided by the multi-bit sigma-delta loops, high precision can be attained when using relatively low-resolution (i.e., 18-bits) converters. Precision is further increased, according to the $\log_2 N$ relation, by operating the converters in parallel. These converters are generally not only high-speed, but also low cost. Therefore, the topology 100 offers the advantages of high speed and high precision, at reasonable cost.

Figure 3:
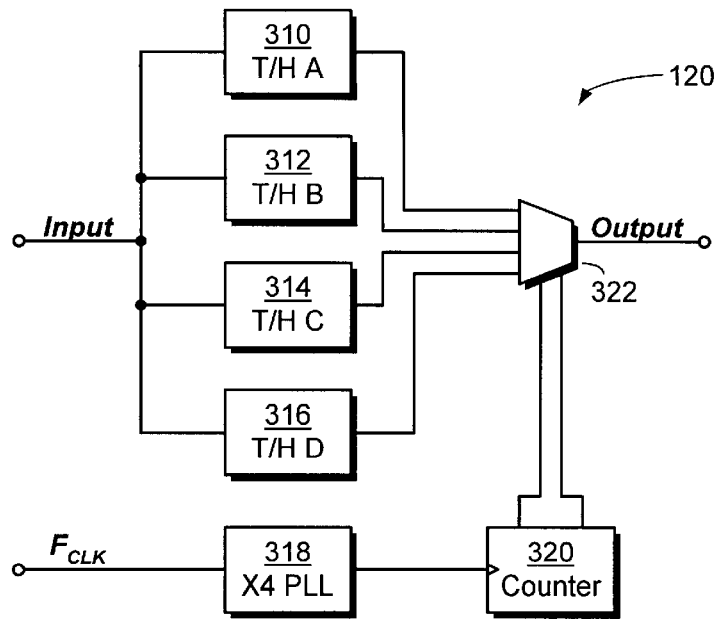
FIG. 3 is a simplified schematic view of a track-and-hold circuit that can be used in the topology of FIG. 1.

FIG. 3 shows the preferred implementation of the track-and-hold circuit 120. The track-and-hold circuit 120 includes a plurality of individual track-and-holds (310, 312, 314, 316) having inputs connected together and outputs connected to different inputs of a multiplexor 322. A counter 320 is coupled to control inputs of the multiplexor 322 for selecting an input for passage to the output of the multiplexor 322. A phase-locked loop 318 receives a clock signal FCLK and multiplies its frequency. The multiplied clock drives the counter 320, which, in turn, causes the multiplexor 322 to repetitively cycle through its inputs at the multiplied rate. Using this implementation, the combination of track-and-hold circuits 310, 312, 314, and 316 can sample at a higher rate than the track-and-hold circuits can sample individually.

Figure 4:
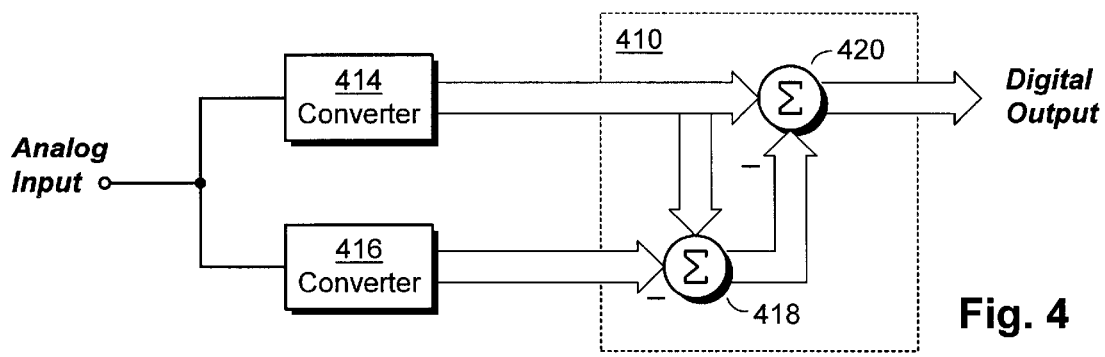
FIG. 4 is a block diagram of a circuit that applies the topology of FIG. 1 for further enhancing precision.

The precision of the topology 100 can be increased even further using the configuration of FIG. 4. According to this arrangement, the analog input signal is conveyed through first and second circuit branches including analog-to-digital converters 414 and 416, respectively. Preferably, the converters 414 and 416 are substantially identical to the converter topology 100 of FIG. 1. An adder 410 receives the digital outputs of the converters 414 and 416. The adder 410 subtracts the digital output of the second converter from the digital output of the first converter to produce an output signal proportional to the noise in the input signal. This noise is then subtracted from the digital output of the first converter 412, to produce an enhanced output signal, "Digital Output".

The topology 100 can be somewhat simplified if it is used in the configuration of FIG. 4. For example, a single track-and-hold circuit 120 can be used for sampling the analog input signal for both converters 414 and 416, rather than requiring a separate track-and-hold for each. In addition, the operations of the combining circuits 116 and digital summers 122 can be incorporated into functionality of the adder 410, rather than being provided as separate structures. The adder 410 is preferably implemented in software using a standard Digital Signal Processing engine. Alternatively, it can be implemented in hardware using dedicated digital circuitry or other circuits, the specific form of which is not critical to the invention.

ALTERNATIVES

Having described one embodiment, numerous alternative embodiments or variations can be made. The embodiment described herein gathers analog outputs from the different ADC stages to effect error correction. This is not strictly required, however. Errors can be corrected using other techniques, or not at all, depending upon a particular application's requirements.

Multi-bit sigma-delta loops can be implemented in a wide variety of ways known to those skilled in the art. For instance, the loop filter 212 can be implemented as an analog control amplifier, such as an integrator, which precedes rather than follows the ADC 214. This and other variations of the sigma-delta loop can be used, as applications require, within the scope of the invention.

Each of these alternatives and variations, as well as others, has been contemplated by the inventors and is intended to fall within the scope of the instant invention. It should be understood, therefore, that the foregoing description is by way of example, and the invention should be limited only by the spirit and scope of the appended claims.

What is claimed is:

1. A topology for converting an analog input signal into a digital output signal, comprising:

an input port for receiving the analog input signal;

an output port for providing a digital output signal that varies in relation with the analog input signal;

a plurality of substantially identical ADC stages, each ADC stage having an analog input and a digital output, each analog input being coupled to the input port; and a combining circuit having a plurality of inputs coupled to the digital outputs of the plurality of ADC stages, and an output coupled to the output port for producing the digital output signal, wherein each ADC stage comprises a multi-bit sigma-delta loop having at least several bits of resolution.

2. A topology as recited in claim 1, wherein the multi-bit sigma-delta loop is a first order sigma-delta loop.

3. A topology as recited in claim 1, wherein the multi-bit sigma-delta loop comprises:

a multi-bit ADC having a digital output; and a multi-bit DAC having a digital input and an analog output, the digital input coupled to the digital output of the multi-bit ADC.

4. A topology as recited in claim 3, wherein the multi-bit sigma-delta loop further comprises:

a summer having a first input coupled to the input port, a second input coupled to the analog output of the multi-bit DAC, and an output providing an error signal proportional to the difference between the signals at the first and second inputs.

5. A topology as recited in claim 4, wherein the multi-bit sigma-delta loop further comprises:
a digital loop filter coupled in series between the output of the multi-bit ADC and the input of the multi-bit DAC.

6. A topology as recited in claim 4, wherein the digital loop filter comprises a digital integrator.

7. A topology as recited in claim 3, wherein the multi-bit ADC and the multi-bit DAC have the same resolution.

8. A topology as recited in claim 7, wherein the multi-bit ADC and the multi-bit DAC are provided on a single integrated circuit.

9. A topology as recited in claim 3, wherein the multi-bit ADC is one of a successive approximation ADC and a flash ADC.

10. A topology as recited in claim 3, wherein the multi-bit ADC has 18-bits of resolution.

11. A topology as recited in claim 1, wherein each ADC stage has a digital output and an analog output, the topology further comprising:
a first analog summer having a plurality of inputs coupled to the analog output of each of the plurality of ADC stages, and an output indicative of the sum of the signals at its plurality of inputs;
a second analog summer having a first input coupled to the analog input port, a second input coupled to the output of the first analog summer, and an output providing an error signal indicative of the difference between signals at the first and second inputs of the second analog summer;
a fine tune ADC having an analog input coupled to the output of the second analog summer for receiving the error signal, and a digital output indicative of the error signal; and
a digital summer for subtracting the error signal from the output of the combining circuit, to generate a corrected digital output signal.

12. A method for converting an analog input signal into a corresponding digital output signal, comprising:
providing the analog input signal to a plurality of substantially ADC stages;
actuating each of the plurality of ADC stages to convert its respective input signal into respective output signal; and
combining the respective output signals to generate the digital output signal,
wherein each ADC stage comprises a multi-bit sigma-delta loop having at least several bits of resolution.

13. A method as recited in claim 12, wherein the multi-bit sigma-delta loop is a first order sigma-delta loop.

14. A method as recited in claim 12, wherein the multi-bit sigma-delta loop comprises:
a multi-bit ADC having a digital output; and
a multi-bit DAC having a digital input and an analog output, the digital input coupled to the digital output of the multi-bit ADC.

15. A topology for converting an analog input signal into a digital output signal, comprising:
an input port for receiving the analog input signal;
an output port for providing a digital output signal that varies in relation with the analog input signal;
a first plurality of substantially identical ADC stages, each ADC stage having an analog input coupled to the input port, and a digital output;
a second plurality of substantially identical ADC stages, each ADC stage having an analog input coupled to the output of the inverting circuit, and a digital output; and
an adder circuit having a plurality of inputs coupled to the digital outputs of the first and second plurality of ADC stages, and an output coupled to the output port for producing the digital output signal,
wherein each ADC stage comprises a multi-bit sigma-delta loop having at least several bits of resolution.

16. A topology as recited in claim 15, wherein the adder circuit adds the digital outputs of the first and second pluralities of ADC stages to produce a sum, and subtracts the sum from the digital outputs of the first plurality of ADC stages to produce the digital output signal.

17. A topology as recited in claim 15, wherein the multi-bit sigma-delta loop is a first order sigma-delta loop, comprising:
a multi-bit ADC having a digital output; and
a multi-bit DAC having a digital input and an analog output, the digital input coupled to the digital output of the multi-bit ADC.

18. A topology as recited in claim 17, wherein the multi-bit sigma-delta loop further comprises:
a digital loop filter coupled in series between the output of the multi-bit ADC and the input of the multi-bit DAC.

19. A topology as recited in claim 17, wherein the multi-bit ADC and the multi-bit DAC have the same resolution.

20. A topology as recited in claim 17, wherein the multi-bit ADC and the multi-bit DAC are provided on a single integrated circuit.

* * * * *